United States Patent
Koo et al.

(10) Patent No.: US 11,547,033 B2
(45) Date of Patent: Jan. 3, 2023

(54) METHOD FOR INSPECTING INSERTION STATES OF PLURALITY OF PINS INCLUDED IN CONNECTOR INSERTED INTO SUBSTRATE, AND SUBSTRATE INSPECTION APPARATUS

(71) Applicant: KOH YOUNG TECHNOLOGY INC., Seoul (KR)

(72) Inventors: Dae Sung Koo, Seoul (KR); Woo Young Lim, Goyang-si (KR); Yong Kim, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 300 days.

(21) Appl. No.: 16/957,317

(22) PCT Filed: Dec. 28, 2018

(86) PCT No.: PCT/KR2018/016884
§ 371 (c)(1),
(2) Date: Jun. 23, 2020

(87) PCT Pub. No.: WO2019/132601
PCT Pub. Date: Jul. 4, 2019

(65) Prior Publication Data
US 2020/0352069 A1 Nov. 5, 2020

(30) Foreign Application Priority Data

Dec. 28, 2017 (KR) .................. 10-2017-0182906
Dec. 27, 2018 (KR) .................. 10-2018-0170569

(51) Int. Cl.
*H05K 13/08* (2006.01)
*G01B 11/06* (2006.01)
*H01R 43/20* (2006.01)

(52) U.S. Cl.
CPC ....... *H05K 13/089* (2018.08); *G01B 11/0608* (2013.01); *H01R 43/205* (2013.01);
(Continued)

(58) Field of Classification Search
CPC ...... H05K 13/04; H05K 13/046; H05K 13/08; H05K 13/081; H05K 13/0812;
(Continued)

(56) References Cited

U.S. PATENT DOCUMENTS

| 5,729,346 A | * | 3/1998 | Joo ..................... G01N 21/956 356/400 |
| 6,513,233 B1 | | 2/2003 | Nakao et al. |

(Continued)

FOREIGN PATENT DOCUMENTS

| CN | 103299728 | 9/2013 |
| CN | 107110789 | 8/2017 |

(Continued)

OTHER PUBLICATIONS

Korean Office Action, with English translation, corresponding to Korean Application No. 10-2018-0170569, dated Oct. 13, 2020.
(Continued)

*Primary Examiner* — Peter Dungba Vo
*Assistant Examiner* — Joshua D Anderson
(74) *Attorney, Agent, or Firm* — Kile Park Reed & Houtteman PLLC

(57) ABSTRACT

A substrate inspection apparatus may include: a communication circuit; a plurality of light sources; an image sensor; at least one memory; and at least one processor. The processor may be configured to: generate insertion state information indicating an insertion state of each of a plurality of pins included in each of a plurality of first connectors by using the pattern light reflected from the pin tail of each of the plurality of pins; detect at least one second
(Continued)

connector having an insertion defect by using the insertion reference information and the insertion state information of each of the plurality of pins; generate a control signal for adjusting at least one first process parameter, based on insertion state information for the plurality of pins included in the at least one second connector; and control the communication circuit to transmit the control signal to the connector insertion apparatus.

14 Claims, 15 Drawing Sheets

(52) U.S. Cl.
CPC ...... *H05K 13/081* (2018.08); *Y10T 29/49131* (2015.01); *Y10T 29/49139* (2015.01); *Y10T 29/53183* (2015.01)

(58) Field of Classification Search
CPC ............. H05K 13/0815; H05K 13/083; H05K 13/089; H01R 43/20; H01R 43/205; G01B 11/0608; Y10T 29/4913; Y10T 29/49131; Y10T 29/49139; Y10T 29/49147; Y10T 29/53174; Y10T 29/53183

See application file for complete search history.

(56) References Cited

U.S. PATENT DOCUMENTS

| | | |
|---|---|---|
| 2010/0306998 A1 | 12/2010 | Nolleck et al. |
| 2014/0009601 A1 | 1/2014 | Cho et al. |
| 2017/0363548 A1 | 12/2017 | Jeong |

FOREIGN PATENT DOCUMENTS

| | | | |
|---|---|---|---|
| JP | 05180780 A | * | 7/1993 |
| JP | 05275900 A | * | 10/1993 |
| JP | 07-167621 | | 7/1995 |
| JP | 08014855 A | * | 1/1996 |
| JP | 10-107499 | | 4/1998 |
| JP | 11-40307 | | 2/1999 |
| JP | 2001-280935 | | 10/2001 |
| JP | 2004-340832 | | 12/2004 |
| JP | 2008-076107 | | 4/2008 |
| KR | 10-2001-0075664 | | 8/2001 |
| KR | 10-0484812 | | 4/2005 |
| KR | 10-2009-0111097 | | 10/2009 |
| KR | 10-2011-0088967 | | 8/2011 |

OTHER PUBLICATIONS

Chinese Office Action, with English translation, corresponding to Chinese Application or Patent No. 201880080098.2, dated Nov. 17, 2020.
Extended European Search Report, corresponding to European Application No. Patent No. 18895879.7, dated Jan. 22, 2021.
International Search report, with English translation, corresponding to International Application No. PCT/KR2018/016884, dated Apr. 5, 2019.
Written Opinion, with English translation, corresponding to International Application No. PCT/KR2018/016884, dated Apr. 5, 2019.
Korean Office Action, with English translation, corresponding to Korean Application No. 10-2018-0170569, dated Mar. 20, 2020.
European Office Action for Application 18 895 879.7, dated Oct. 6, 2022.

* cited by examiner

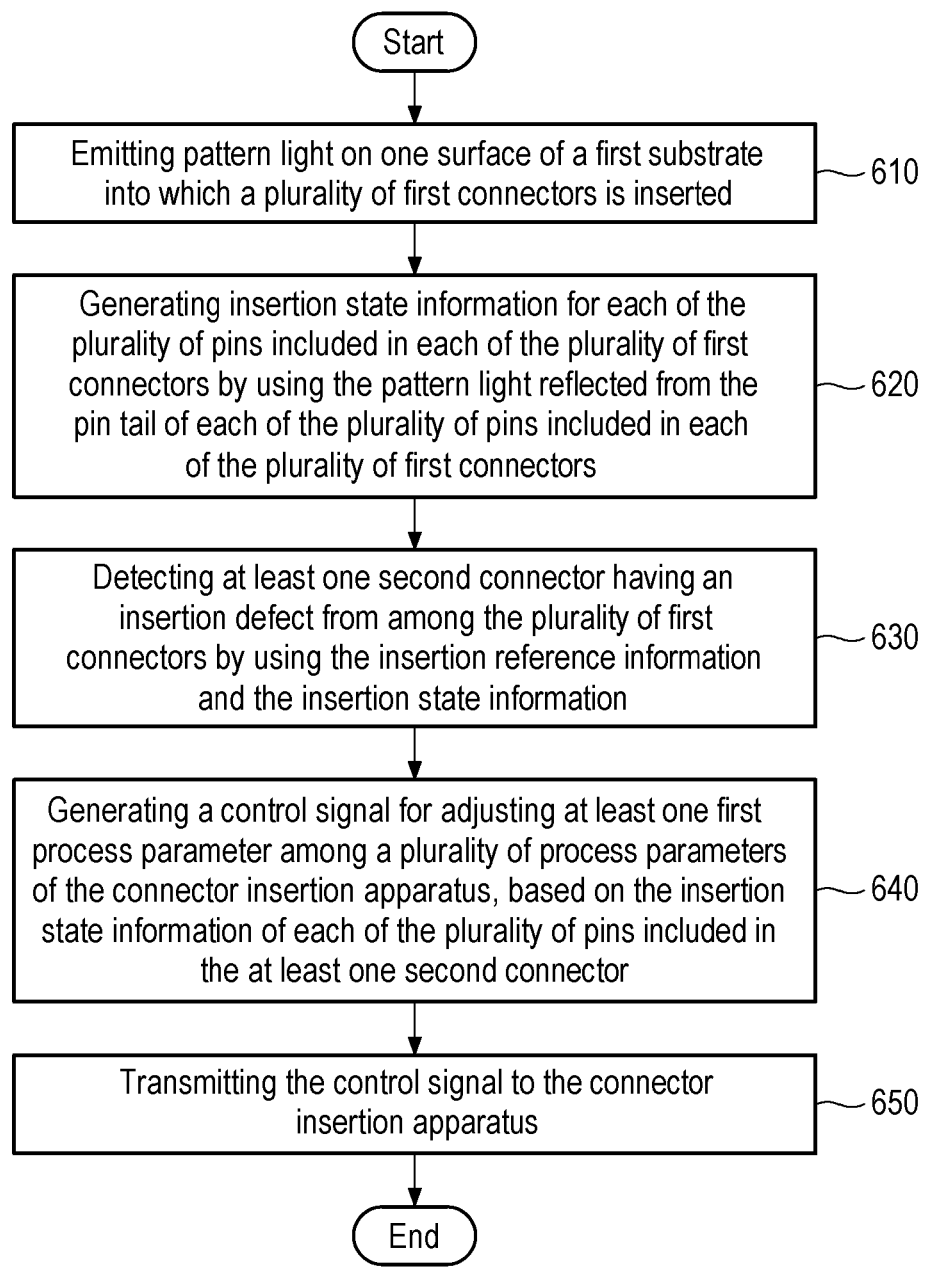

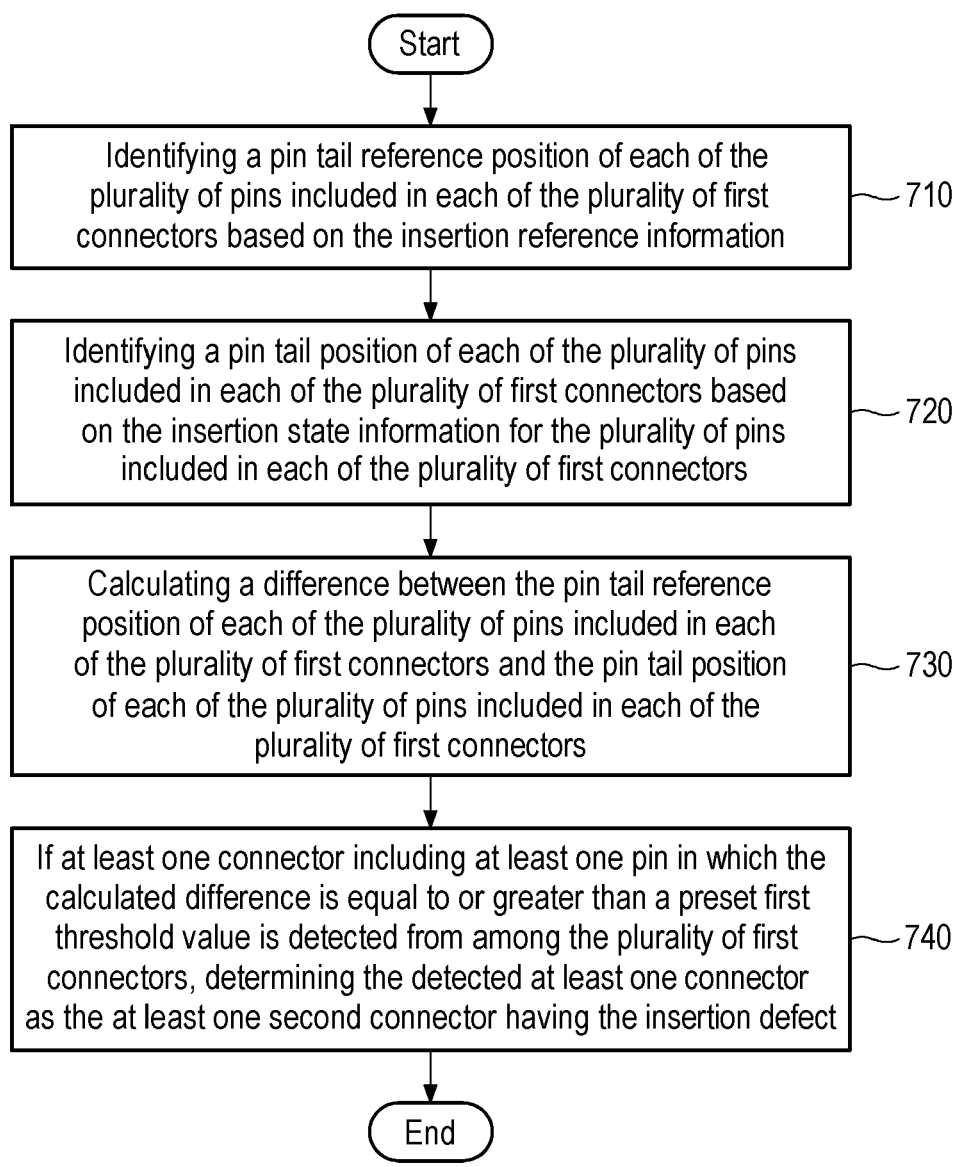

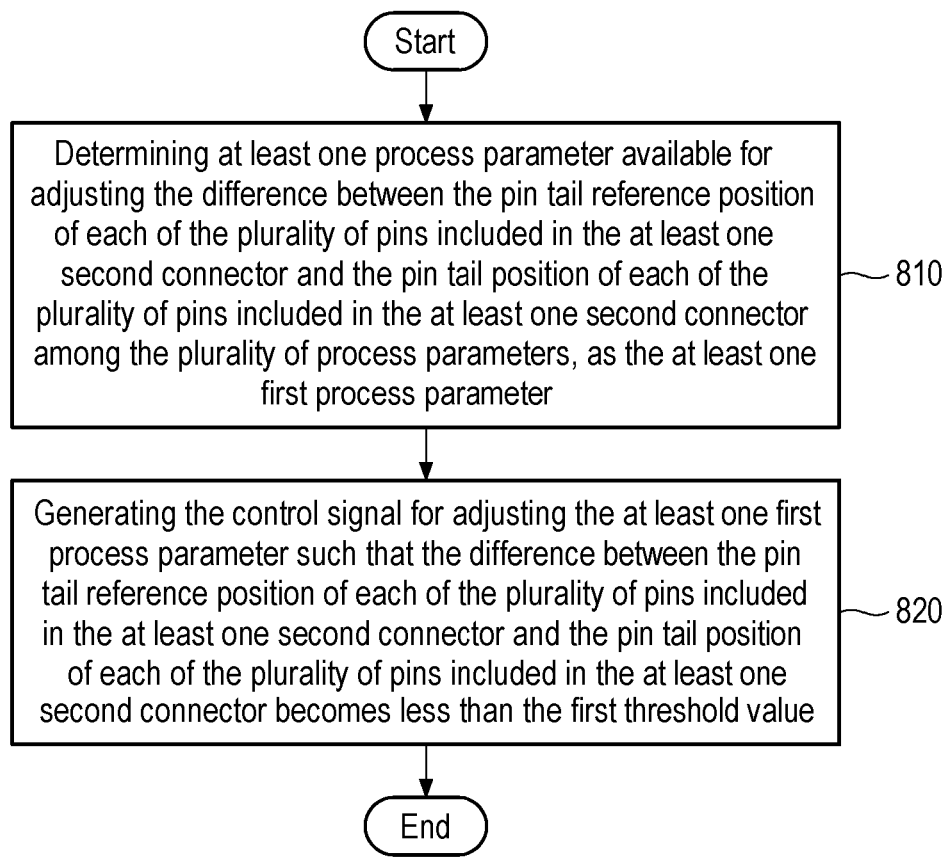

FIG. 9
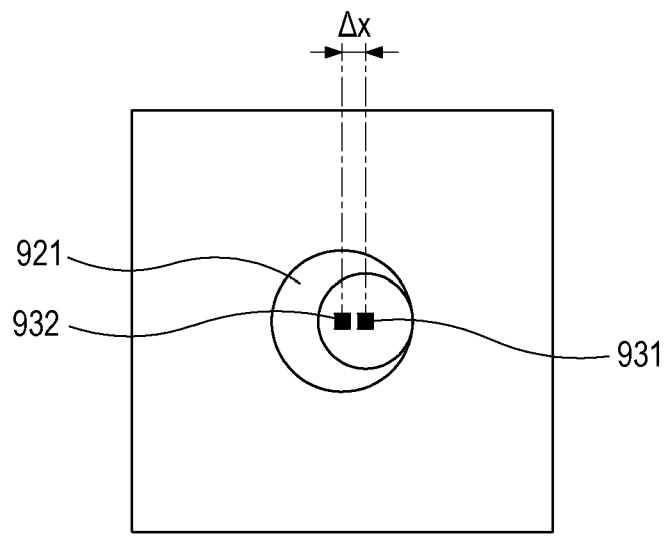
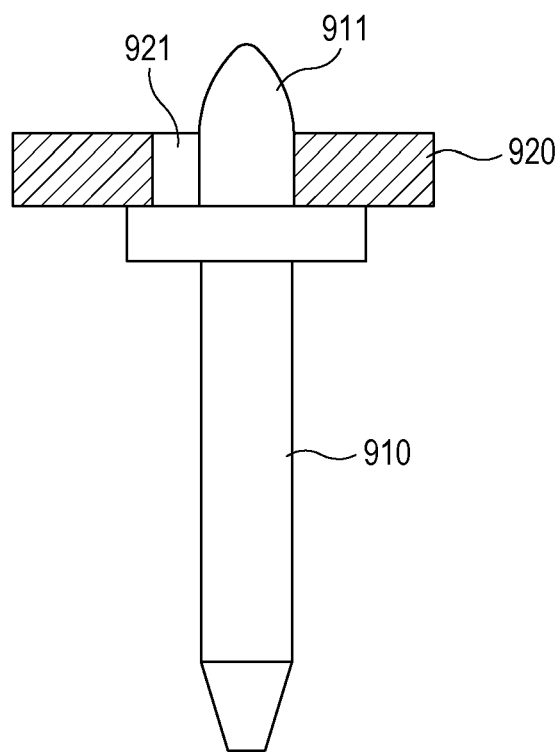

METHOD FOR INSPECTING INSERTION STATES OF PLURALITY OF PINS INCLUDED IN CONNECTOR INSERTED INTO SUBSTRATE, AND SUBSTRATE INSPECTION APPARATUS

TECHNICAL FIELD

The present disclosure relates to a method for inspecting insertion states of a plurality of connectors inserted into a substrate, and a substrate inspection apparatus. More specifically, the present disclosure relates to a method for inspecting insertion states of a plurality of pins included in each of a plurality of connectors in order to inspect an insertion state of the plurality of connectors, and a substrate inspection apparatus.

BACKGROUND

Generally, a pin or connector insertion apparatus inserts a plurality of pins or a plurality of connectors including a plurality of pins into a plurality of holes formed on a substrate, for example, a printed circuit board (PCB). The substrate into which the plurality of pins or the plurality of connectors is inserted may be electrically connected to another component or substrate by using at least one of the inserted pins or at least one of the inserted connectors. Specifically, the pin or connector insertion apparatus moves an insertion head loaded with at least one pin or connector to a preset pin or connector insertion position, and then applies an insertion force to an insertion finger, whereby the insertion finger presses and inserts the pin or connector loaded on the insertion head into a hole formed in the substrate.

However, due to the characteristics of the pins or connectors to be inserted, the setting error of the pin or connector insertion apparatus, the mechanical separation and defect of the pin or connector insertion apparatus, the non-planarity of the substrate, and the like, an error may occur in the pin or connector insertion process performed by the pin or connector insertion apparatus. Due to this, an insertion defect may occur in the pin or connector inserted into the substrate.

It is time-consuming and costly for a user to inspect directly the insertion state of the pin or connector in order to detect such an insertion defect of the pin or connector. Moreover, the inspection may not be accurately performed. In addition, it is also time-consuming and costly for a user to directly take measures with respect to the pin or connector insertion apparatus in order to reduce the insertion defect of the pin or connector, which may lead to the problem that the productivity is deteriorated.

SUMMARY

Various embodiments of the present disclosure provide a substrate inspection apparatus capable of emitting pattern light on a substrate into which a plurality of connectors is inserted, inspecting an insertion state of a plurality of pins included in each of the connectors, and adjusting process parameters of a connector insertion apparatus according to the insertion state of the plurality of pins included in a connector determined to have an insertion defect as a result of inspection.

Various embodiments of the present disclosure provide a method capable of emitting pattern light on a substrate into which a plurality of connectors is inserted, inspecting an insertion state of a plurality of pins included in each of the connectors, and adjusting process parameters of a connector insertion apparatus according to the insertion state of the plurality of pins included in a connector determined to have an insertion defect as a result of inspection.

According to various embodiments of the present disclosure, a substrate inspection apparatus for inspecting an insertion state of a plurality of pins included in each of a plurality of connectors inserted into a substrate may include: a communication circuit configured to communicate with a connector insertion apparatus for inserting the plurality of connectors including the plurality of pins into the substrate; a plurality of light sources configured to emit pattern light on one surface of a first substrate into which a plurality of first connectors is inserted by the connector insertion apparatus, the plurality of first connectors being inserted into the other surface of the first substrate; an image sensor configured to receive the pattern light reflected from a pin tail of each of the plurality of pins included in each of the plurality of first connectors; at least one memory configured to store insertion reference information indicating a pin tail reference height and a pin tail reference position set for each of the plurality of pins included in each of the plurality of first connectors; and at least one processor, wherein the at least one processor may be configured to: generate insertion state information indicating an insertion state of each of the plurality of pins included in each of the plurality of first connectors by using the pattern light reflected from the pin tail of each of the plurality of pins included in each of the plurality of first connectors and received by the image sensor; detect at least one second connector having an insertion defect from among the plurality of first connectors by using the insertion reference information and the insertion state information of each of the plurality of pins included in each of the plurality of first connectors; generate a control signal for adjusting at least one first process parameter among a plurality of process parameters of the connector insertion apparatus, based on the insertion state information of each of the plurality of pins included in the at least one second connector; and control the communication circuit to transmit the control signal to the connector insertion apparatus.

In one embodiment, the insertion state information may include information indicating a pin tail height, and information indicating a pin tail position.

In one embodiment, the plurality of process parameters may include a process parameter for adjusting a connector insertion force, a process parameter for adjusting a connector insertion position, a process parameter for adjusting a connector insertion speed, and a process parameter for adjusting a movement speed of a connector insertion head used for connector insertion.

In one embodiment, the at least one processor may be configured to: identify a pin tail reference position of each of the plurality of pins included in each of the plurality of first connectors based on the insertion reference information; identify a pin tail position of each of the plurality of pins included in each of the plurality of first connectors based on the insertion state information; calculate a difference between the pin tail reference position of each of the plurality of pins included in each of the plurality of first connectors and the pin tail position of each of the plurality of pins included in each of the plurality of first connectors; and if at least one connector including at least one pin in which the calculated difference is equal to or greater than a preset first threshold value is detected from among the plurality of first connectors, determine the detected at least one connector as the at least one second connector having the insertion defect.

In one embodiment, the at least one processor may be configured to: determine at least one process parameter available for adjusting the difference between the pin tail reference position of each of the plurality of pins included in at least one second connector and the pin tail position of each of the plurality of pins included in the at least one second connector among the plurality of process parameters, as the at least one first process parameter; and generate the control signal for adjusting the at least one first process parameter such that the difference between the pin tail reference position of each of the plurality of pins included in the at least one second connector and the pin tail position of each of the plurality of pins included in the at least one second connector becomes less than the first threshold value.

In one embodiment, the at least one processor may be configured to: identify a pin tail reference height of each of the plurality of pins included in each of the plurality of first connectors based on the insertion reference information; identify a pin tail height of each of the plurality of pins included in each of the plurality of first connectors based on the insertion state information; calculate a difference between the pin tail reference height of each of the plurality of pins included in each of the plurality of first connectors and the pin tail height of each of the plurality of pins included in each of the plurality of first connectors; and if at least one connector including at least one pin in which the calculated difference is equal to or greater than a preset second threshold value is detected from among the plurality of first connectors, determine the detected at least one connector as the at least one second connector having the insertion defect.

In one embodiment, the at least one processor may be configured to: determine at least one process parameter available for adjusting the difference between the pin tail reference height of each of the plurality of pins included in the at least one second connector and the pin tail height of each of the plurality of pins included in the at least one second connector among the plurality of process parameters, as the at least one first process parameter; and generate the control signal for adjusting the at least one first process parameter such that the difference between the pin tail reference height of each of the plurality of pins included in the at least one second connector and the pin tail height of each of the plurality of pins included in the at least one second connector becomes less than the second threshold value.

According to various embodiments of the present disclosure, a method for inspecting insertion states of a plurality of pins included in each of a plurality of connectors inserted into a substrate by a substrate inspection apparatus may include: emitting pattern light on one surface of a first substrate into which a plurality of first connectors is inserted by a connector insertion apparatus, the plurality of first connectors being inserted into the other surface of the first substrate; receiving the pattern light reflected from a pin tail of each of the plurality of pins included in each of the plurality of first connectors; generating insertion state information indicating an insertion state of each of the plurality of pins included in each of the plurality of first connectors by using the received pattern light reflected from the pin tail of each of the plurality of pins included in each of the plurality of first connectors; detecting at least one second connector having an insertion defect from among the plurality of first connectors by using insertion reference information indicating a pin tail reference height and a pin tail reference position set for each of the plurality of pins included in each of the plurality of first connectors and the insertion state information; generating a control signal for adjusting at least one first process parameter among a plurality of process parameters of the connector insertion apparatus, based on the insertion state information of each of the plurality of pins included in the at least one second connector; and transmitting the control signal to the connector insertion apparatus.

In one embodiment, the insertion state information may include information indicating a pin tail height of each of the plurality of pins included in each of the plurality of connectors and information indicating a pin tail position of each of the plurality of pins included in each of the plurality of connectors.

In one embodiment, the plurality of process parameters may include a process parameter for adjusting a connector insertion force, a process parameter for adjusting a connector insertion position, a process parameter for adjusting a connector insertion speed, and a process parameter for adjusting a movement speed of a connector insertion head used for connector insertion.

In one embodiment, the step of detecting at least one second connector having the insertion defect may include: identifying a pin tail reference position of each of the plurality of pins included in each of the plurality of first connectors based on the insertion reference information; identifying a pin tail position of each of the plurality of pins included in each of the plurality of first connectors based on the insertion state information; calculating a difference between the pin tail reference position of each of the plurality of pins included in each of the plurality of first connectors and the pin tail position of each of the plurality of pins included in each of the plurality of first connectors; and if at least one connector including at least one pin in which the calculated difference is equal to or greater than a preset first threshold value is detected from among the plurality of first connectors, determine the detected at least one connector as the at least one second connector having the insertion defect.

In one embodiment, the step of generating a control signal for adjusting at least one first process parameter may include: determining at least one process parameter available for adjusting the difference between the pin tail reference position of each of the plurality of pins included in the at least one second connector and the pin tail position of each of the plurality of pins included in the at least one second connector among the plurality of process parameters, as the at least one first process parameter; and generating the control signal for adjusting the at least one first process parameter such that the difference between the pin tail reference position of each of the plurality of pins included in the at least one second connector and the pin tail position of each of the plurality of pins included in the at least one second connector becomes less than the first threshold value.

In one embodiment, the step of detecting at least one second connector having the insertion defect may include: identifying a pin tail reference height of each of the plurality of pins included in each of the plurality of first connectors based on the insertion reference information; identifying a pin tail height of each of the plurality of pins included in each of the plurality of first connectors based on the insertion state information; calculating a difference between the pin tail reference height of each of the plurality of pins included in each of the plurality of first connectors and the pin tail height of each of the plurality of pins included in each of the plurality of first connectors; and if at least one connector including at least one pin in which the calculated difference is equal to or greater than a preset second threshold value is detected from among the plurality of first connectors, determining the detected at least one connector as the at least one second connector having the insertion defect.

In one embodiment, the step of generating a control signal for adjusting at least one first process parameter may include: determining at least one process parameter available for adjusting the difference between the pin tail reference height of each of the plurality of pins included in the at least one second connector and the pin tail height of each of the plurality of pins included in the at least one second connector among the plurality of process parameters, as the at least one first process parameter; and generating the control signal for adjusting the at least one first process parameter such that the difference between the pin tail reference height of each of the plurality of pins included in the at least one second connector and the pin tail height of each of the plurality of pins included in the at least one second connector becomes less than the second threshold value.

According to the present disclosure, in some embodiments, the substrate inspection apparatus may emit pattern light on one surface of a substrate into which a plurality of connectors is inserted, may detect at least one connector having a defect among the plurality of connectors by using the pattern light reflected from a pin tail of each of a plurality of pins included in the plurality of connectors, and may control a connector insertion apparatus, by using the insertion state information of a plurality of pins included in at least one connector thus detected, so as to adjust at least one process parameter among a plurality of process parameters of the connector insertion apparatus. This makes it possible to quickly and accurately inspect the insertion state of the plurality of connectors inserted into the substrate, and to efficiently control the connector insertion apparatus so as to reduce the insertion defect.

BRIEF DESCRIPTION OF DRAWINGS

FIG. 6 is a flowchart of a method for inspecting an insertion state of a plurality of connectors by the substrate inspection apparatus according to various embodiments of the present disclosure.

FIG. 7 is a flowchart of a method for detecting at least one second connector having an insertion defect by using a pin tail position according to various embodiments of the present disclosure.

FIG. 8 is a flowchart of a method for generating a control signal for adjusting a process parameter, based on pin insertion state information of at least one second connector having an insertion defect detected by using a pin tail position according to various embodiments of the present disclosure.

FIG. 9 illustrates the pin included in the connector having an insertion defect detected by using the pin tail position according to various embodiments of the present disclosure.

DETAILED DESCRIPTION

Figure 1:
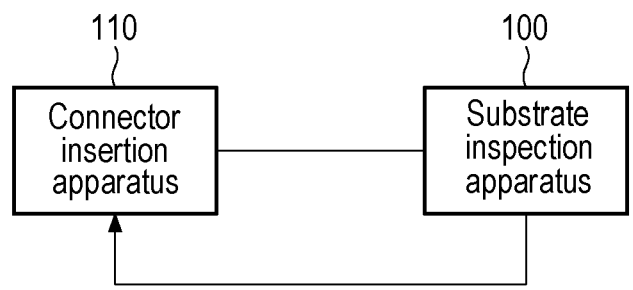
FIG. 1 is a view for explaining a method of controlling a connector insertion apparatus by a substrate inspection apparatus according to various embodiments of the present disclosure.

Embodiments of the present disclosure are illustrated for describing the technical spirit of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected only for more clear illustration of the present disclosure, and are not intended to limit the scope of claims in accordance with the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression can include meanings of plurality, unless otherwise mentioned, and the same applies to a singular expression stated in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factor influencing the decision, the action of judgment or the operation.

When a certain component is described as "coupled to" or "connected to" another component, this should be understood as having the meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, identical or corresponding components are indicated by identical reference numerals. In the following description of embodiments, repeated descriptions of the identical or corresponding components will be omitted. However, even if a description of a component is omitted, such a component is not intended to be excluded in an embodiment.

Although process steps, method steps, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof is essential for at least one of various embodiments of the present disclosure, and that the illustrated processes are desirable.

FIG. 1 is a view for explaining a method of controlling a connector insertion apparatus by a substrate inspection apparatus according to various embodiments of the present disclosure. According to various embodiments of the present disclosure, the substrate inspection apparatus 100 may perform inspection of a substrate into which a plurality of connectors is inserted by a connector insertion apparatus 110. For example, the connector may include a housing with one open surface and a plurality of pins disposed in the housing. The plurality of pins may be disposed within the housing such that a pin tail of each of the pins faces the open surface of the housing. The connector insertion apparatus 110 may perform a connector insertion process of inserting a connector including a plurality of pins into a substrate, and may transfer the substrate into which the plurality of connectors is inserted, to the substrate inspection apparatus 100. Hereinafter, description will be made mainly on a case where the connector insertion apparatus 110 inserts a connector including a plurality of pins into a substrate. However, the present disclosure is not limited thereto. The connector insertion apparatus 110 may insert individual pins into the substrate.

In one embodiment, the substrate inspection apparatus 100 may inspect the insertion state of the plurality of pins included in each of the plurality of connectors inserted into the substrate transferred from the connector insertion apparatus 110. The substrate inspection apparatus 100 may emit pattern light on one surface of the substrate. One surface of the substrate on which the pattern light is emitted and the other surface of the substrate into which the plurality of connectors is inserted may be opposite surfaces.

In one embodiment, by the connector insertion force applied to the connector including a plurality of pins toward the other surface of the substrate by the connector insertion apparatus 110, the plurality of pins included in the connector may be inserted into the substrate through a plurality of holes formed in the substrate. In addition, the length of the pin tail of each of the plurality of pins included in the connector is set to be longer than the thickness of the substrate in order to ensure that the inserted connector is fixed to the substrate. Therefore, after the insertion of the connector is completed, a portion of the pin tail may protrude from one surface of the substrate. Since the pin tail is a portion of the pin as described above, the insertion state of the pin may be determined by inspecting the protruding state of the pin tail. In the case where the insertion state of the plurality of pins included in the connector cannot be directly inspected by using pattern light, first-wavelength light, second-wavelength light and third-wavelength light due to the arrangement of the plurality of pins in the housing as in the connector, the insertion state of each of the plurality of pins may be determined by inspecting the protruding state of the pin tail of each of the plurality of pins. In addition, since the plurality of pins is included in the connector, the insertion state of the connector including the plurality of pins may also be determined by determining the insertion state of each of the plurality of pins.

The substrate inspection apparatus 100 may receive the pattern light reflected from the pin tail of each of the plurality of pins included in the plurality of connectors. The substrate inspection apparatus 100 may measure a pin tail height, a pin tail position and the like of each of the plurality of pins by using the received pattern light, and may inspect the insertion state of the plurality of pins included in each of the plurality of connectors by using the measurement information about the pin tail of each of the plurality of pins. A specific method for inspecting the insertion state of the plurality of pins included in each of the plurality of connectors by the substrate inspection apparatus 100 will be described later.

According to various embodiments of the present disclosure, the substrate inspection apparatus 100 may control the connector insertion apparatus 110 by using the inspection result of the insertion state of the plurality of pins included in each of the plurality of connectors inserted into the substrate. For example, the substrate inspection apparatus 100 may generate a control signal for adjusting at least one process parameter among a plurality of process parameters related to the connector insertion process of the connector insertion apparatus 110 by using the inspection result. The substrate inspection apparatus 100 may control the connector insertion apparatus 110 by transmitting the generated control signal to the connector insertion apparatus 110 so that the connector insertion apparatus 110 can adjust at least one process parameter according to the received control signal. A specific method for generating the control signal for adjusting at least one process parameter by the substrate inspection apparatus 100 will be described later.

As described above, the substrate inspection apparatus 100 may quickly and accurately inspect an insertion state of the plurality of connectors inserted into the substrate by using the measurement information of the pin tail measured using the pattern light. In addition, the substrate inspection apparatus 100 may use the inspection result to efficiently control the connector insertion apparatus 110 to reduce the insertion defect caused by an error of the connector insertion apparatus 110.

Figure 2:
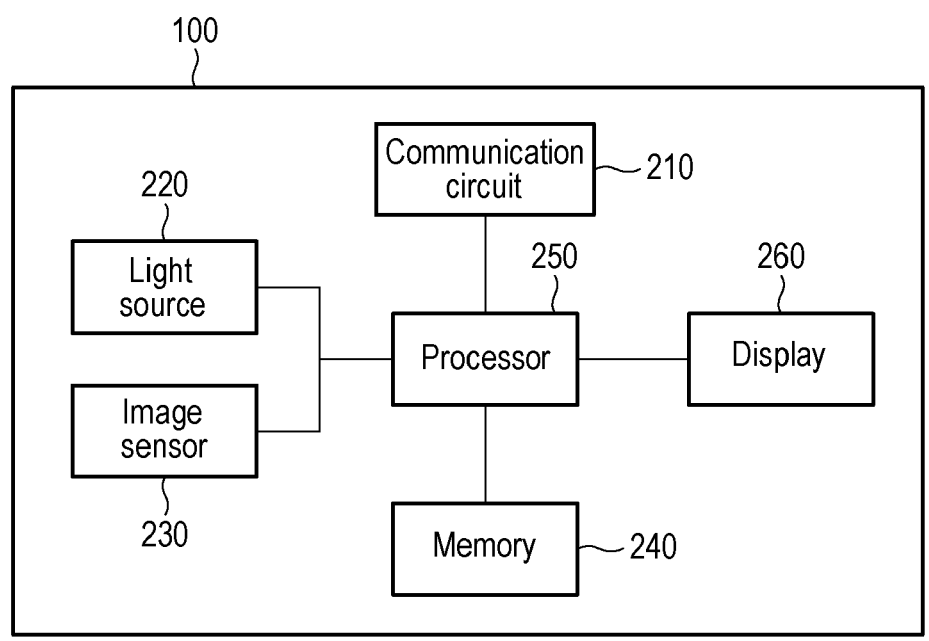
FIG. 2 is a block diagram of the substrate inspection apparatus according to various embodiments of the present disclosure.

FIG. 2 is a block diagram of the substrate inspection apparatus according to various embodiments of the present disclosure. According to various embodiments of the present disclosure, the substrate inspection apparatus 100 may include a communication circuit 210, a memory 240, a light source 220, an image sensor 230 and a processor 250. In addition, the substrate inspection apparatus 100 may further include a display 260. The components included in the substrate inspection apparatus 100 are electrically connected to each other to transmit and receive signals and data. Hereinafter, for the sake of convenience of description, each of the components included in the substrate inspection apparatus 100 is expressed in a singular form. However, the present disclosure is not limited thereto. Each of the components may be plural.

In one embodiment, the communication circuit 210 may communicate with an external electronic device or an external server. For example, the communication circuit 210 may establish communication between the substrate inspection apparatus 100 and the connector insertion apparatus 110 for inserting a connector into a substrate. The communication circuit 210 may be connected to a network through wireless communication or wired communication to communicate with an external electronic device or an external server. As another example, the communication circuit 210 may be connected to an external electronic device in a wired manner to perform communication.

The wireless communication may include, for example, cellular communication (e.g., LTE, LTE Advance (LTE-A), Code Division Multiple Access (CDMA), Wideband CDMA (WCDMA), Universal Mobile Telecommunications System (UMTS), Wireless Broadband (WiBro), and the like). Furthermore, the wireless communication may include short-range wireless communication (e.g., Wireless Fidelity (WiFi), Light Fidelity (LiFi), Bluetooth, Bluetooth Low Power (BLE), Zigbee, Near Field Communication (NFC), the like).

In one embodiment, the light source 220 may emit pattern light on an inspection target (e.g., a substrate). The light source 220 may emit the pattern light on the entire inspection target, or may emit the pattern light on at least one object (e.g., a pin inserted into the substrate) included in the inspection target. For example, the light source 220 may include a grating (not shown), a grating transfer device (not shown), and a projection lens part (not shown). The grating may convert the light emitted from the light source 220 into pattern light. The grating may be transferred by a grating transfer mechanism, for example a piezo actuator (PZT), to generate phase-shifted pattern light. The projection lens part may allow the pattern light generated by the grating to be emitted on the inspection target.

As another example, the light source 220 may include Digital Light Processing (DLP) or Liquid Crystal on Silicon (LCoS). The DLP or LCoS may convert light emitted from the light source 220 into pattern light so that the pattern light can be emitted on the inspection target.

For example, the light source 220 may emit pattern light on one surface of a first substrate. One surface of the first substrate and the other surface of the first substrate into which the plurality of connectors is inserted may be opposite surfaces. The pattern light may be light having a pattern of a constant or specific period, which is emitted to measure a three-dimensional shape of the inspection target. The light source 220 may emit pattern light in which the brightness of stripes has a sine wave shape, on-off type pattern light in which bright and dark portions are repeatedly displayed, triangular-wave pattern light in which the change in brightness is a triangular waveform, or the like. However, this is merely for description purposes, and the present disclosure is not limited thereto. The light source 220 may emit various types of pattern light in which the change in brightness is repeated at a constant or specific period.

Furthermore, the light source 220 may emit first-wavelength light, second-wavelength light, and third-wavelength light on the inspection target. The light source 220 may emit first-wavelength light, second-wavelength light and third-wavelength light on the entire inspection target or at least one object included in the inspection target. For example, the light source 220 may emit first-wavelength light, second-wavelength light and third-wavelength light on one surface of the first substrate.

In one embodiment, the light source 220 may sequentially emit first-wavelength light, second-wavelength light, and third-wavelength light, or may simultaneously emit at least two kinds of light. For example, the first-wavelength light may be red light, the second-wavelength light may be green light, and the third-wavelength light may be blue light. However, this is merely for description purposes, and the present disclosure is not limited thereto. The first-wavelength light, the second-wavelength light and the third-wavelength light may be light having different wavelengths.

Hereinafter, for the sake of convenience of description, there will be mainly described a case where the light source 220 emits pattern light. However, the present disclosure is not limited thereto. The light source 220 may additionally emit first-wavelength light, second-wavelength light, and third-wavelength light, or may emit the pattern light, the first-wavelength light, the second-wavelength light and the third-wavelength light.

In one embodiment, the image sensor 230 may receive the pattern light reflected from the pin tail of each of a plurality of pins included in the plurality of connectors. For example, the image sensor 230 may receive the pattern light reflected from the pin tail of each of the plurality of pins protruding from one surface of the first surface, and may use the received pattern light to generate an image (e.g., a three-dimensional image) for the pin tail of each of the plurality of pins.

Furthermore, the image sensor 230 may receive first-wavelength light, second-wavelength light and third-wavelength light, which are reflected from the pin tail of each of the plurality of pins. For example, when first-wavelength light, second-wavelength light and third-wavelength light are emitted from the light source 220 on one surface of the first substrate, the image sensor 230 may receive the first-wavelength light, the second-wavelength light and the third-wavelength light reflected from the pin tail of each of the plurality of pins, and may use the received first-wavelength light, the received second-wavelength light and the received third-wavelength light to generate an image (e.g., a two-dimensional image) for the pin tail of each of the plurality of pins. The image sensor 230 may transmit the generated image for the pin tail of each of the plurality of pins to the processor 250. In addition, the image sensor 230 may include a plurality of image sensors that can receive light in the same direction or different directions.

For example, the image sensor 230 may include a Charge Coupled Device (CCD) camera, a Complementary Metal Oxide Semiconductor (CMOS) camera, or the like. However, this is merely for description purposes, and the present disclosure is not limited thereto.

In one embodiment, the memory 240 may store instructions or data related to at least one other component of the substrate inspection apparatus 100. Furthermore, the memory 240 may store software and/or programs. For example, the memory 240 may include an internal memory or an external memory. The internal memory may include at least one of a volatile memory (e.g., a DRAM, an SRAM or an SDRAM), and a non-volatile memory (e.g., a flash memory, a hard drive or a solid state drive (SSD)). The external memory may be functionally or physically connected to the substrate inspection apparatus 100 through various interfaces.

In one embodiment, the memory 240 may store instructions for causing the processor 250 to operate. For example, the memory 240 may store instructions that cause the processor 250 to control other components of the substrate inspection apparatus 100 and to interwork with an external electronic device or server. The processor 250 may control other components of the substrate inspection apparatus 100 based on the instructions stored in the memory 240, and may interwork with an external electronic device or server. Hereinafter, the operation of the substrate inspection apparatus 100 will be described by focusing on the respective components of the substrate inspection apparatus 100. In addition, instructions for causing the respective components to perform operations may be stored in the memory 240.

In one embodiment, the memory 240 may store insertion reference information indicating a pin tail reference height and a pin tail reference position set for the plurality of pins included in each of the first connectors inserted into the first substrate. As described with reference to FIG. 1, each of the plurality of pins included in the connector is disposed in the housing and is difficult to be directly inspected by using pattern light or the like. Thus, the insertion state of the connector is determined based on the protruding state of the pin tail. Therefore, the insertion reference information may indicate a pin tail reference height and a pin tail reference position. Accordingly, the pin reference height and the pin reference position set for the plurality of pins included in each of the plurality of first connectors may be used to determine an insertion defect of the plurality of pins included in each of the plurality of first connectors. The insertion reference information may be set according to design information of the first substrate or a user input.

Furthermore, the memory 240 may further store information about a plurality of process parameters related to the connector insertion process of the connector insertion apparatus 110 and information about values of a plurality of process parameters used in the connector insertion process performed on the first substrate by the connector insertion apparatus 110. The information about the plurality of process parameters and the information about the values of the plurality of process parameters may be received from the connector insertion apparatus 110 and stored in the memory 240, or may be generated by a user input and stored in the memory 240.

For example, the information about the plurality of process parameters may include information indicating whether each of the plurality of process parameters can affect a connector insertion position, an inserted connector height, or the like. For example, it may be confirmed by using the information about the plurality of process parameters that a specific process parameter can affect a connector insertion position but cannot affect an inserted connector height. However, this is merely for description purposes, and the present disclosure is not limited thereto. One process parameter may affect both the connector insertion position and the connector height.

The information about the values of the plurality of process parameters may be used to determine how much to adjust at least one process parameter to be adjusted, when the adjustment of at least one process parameter among the plurality of process parameters is needed to reduce an insertion defect.

For example, the plurality of process parameters related to the connector insertion process may include at least two of a process parameter for adjusting a connector insertion force, a process parameter for adjusting a connector insertion position, a process parameter for adjusting a connector insertion speed, a process parameter for adjusting a movement speed of a head used for connector insertion and a process parameter for adjusting a position of an anvil. However, this is merely for description purposes, and the present disclosure is not limited thereto. The plurality of process parameters may include various parameters related to the connector insertion process of the connector insertion apparatus 110.

In one embodiment, the processor 250 may drive an operating system or an application program to control at least one other component of the substrate inspection apparatus 100, and may perform various data processing processes, calculation processes, and the like. For example, the processor 250 may include a central processing unit or the like, and may be implemented by a System on Chip (SoC).

In one embodiment, the display 260 may include, for example, a liquid crystal display (LCD), a light emitting diode (LED) display, an organic light emitting diode (OLED) display, or the like. For example, the display 260 may display various contents (e.g., text, images, videos, icons, and/or symbols, etc.) to the user. The display 260 may include a touch screen, and may receive, for example, a touch, gesture, proximity, or hovering input performed by using an electronic pen or a user's body part.

In one embodiment, the processor 250 may generate insertion state information indicating an insertion state of each of the plurality of pins included in each of the plurality of first connectors by using the pattern light reflected from the pin tail of each of the plurality of pins included in each of the plurality of first connectors and received by the image sensor 230. For example, the processor 250 may generate insertion state information for the plurality of pins included in each of the plurality of first connectors by using the image for the pin tail of each of the plurality of pins generated by the image sensor 230 by using the pattern light reflected from the pin tail of each of the plurality of pins. As another example, the image sensor 230 may transmit information about the received pattern light to the processor 250. The processor 250 may generate an image for the pin tail of each of the plurality of pins, and may generate insertion state information for the plurality of pins included in each of the plurality of connectors by using the image for the pin tail of each of the plurality of pins. The processor 250 may display the generated insertion state information through the display 260. This enables the user to identify the insertion state of the plurality of pins included in each of the plurality of first connectors inserted into the first substrate.

In addition, the processor 250 may generate insertion state information for the plurality of pins included in each of the plurality of first connectors by using the image for the pin tail of each of the plurality of pins generated by the image sensor 230 by using the first-wavelength light, the second-wavelength light and the third-wavelength light reflected from the pin tail of each of the plurality of pins.

For example, the insertion state information may include information indicating a pin tail height of each of the plurality of pins included in the connector, and information indicating a pin tail position. As described with reference to FIG. 1, the connector includes the housing in which the plurality of pins is disposed. Therefore, the insertion state of the plurality of pins included in the connector cannot be directly inspected by using pattern light, first-wavelength light, second-wavelength light and third-wavelength light. Thus, the processor 250 may determine the insertion state of the plurality of pins by inspecting the protruding state of the pin tail of each of the plurality of pins protruding from one surface of the substrate. In addition, the processor 250 may determine the insertion state of the connector including the plurality of pins according to the determination result. However, this is merely for description purposes, and the present disclosure is not limited thereto. The insertion state information may include various kinds of information available for determining the insertion state of the plurality of pins included in the connector.

In one embodiment, the processor 250 may detect at least one second connector having an insertion defect among the plurality of first connectors by using the insertion reference information and the insertion state information of the plurality of pins included in each of the plurality of first connectors. For example, the processor 250 may detect at least one second connector having an insertion defect by comparing the insertion reference information with the insertion state information of the plurality of pins included in the plurality of first connectors. Moreover, the processor 250 may display information about the detected at least one second connector on the display 260. This enables the user to identify at least one second connector having an insertion defect. The insertion state information about the plurality of pins included in the detected at least one second connector may be used to control the connector insertion apparatus 110. A specific method of detecting at least one second connector having an insertion defect will be described later.

In one embodiment, the processor 250 may generate a control signal for adjusting at least one first process parameter among the plurality of process parameters of the connector insertion apparatus 110, based on the insertion state information of each of the plurality of pins included in at least one second connector having an insertion defect. The processor 250 may determine at least one first process parameter to be subjected to adjustment among the plurality of process parameters, based on the insertion state information for the plurality of pins included in the at least one second connector, and may generate a control signal for adjusting the determined at least one first process parameter.

The processor 250 may control the communication circuit 210 to transmit the generated control signal to the connector insertion apparatus 110. A specific method for determining at least one first process parameter to be adjusted and generating a control signal for adjusting the at least one first process parameter will be described later.

In one embodiment, the connector insertion apparatus 110 may adjust at least one first process parameter according to the received control signal. After adjusting the at least one first process parameter, the connector insertion apparatus 110 may perform a process of inserting a plurality of first connectors into a substrate. The substrate inspection apparatus 100 may perform inspection on the substrate into which the plurality of first connectors is inserted, in the same manner as described above. When an insertion defect occurs in at least one of the plurality of first connectors inserted into the substrate, the substrate inspection apparatus 100 may generate a control signal for adjusting at least one of the plurality of process parameters of the connector insertion apparatus 110 in the same manner as described above, and may transmit the control signal to the connector insertion apparatus 110 once again. While repeating the above process, the substrate inspection apparatus 100 may control the connector insertion apparatus 110 so that the connector insertion apparatus 110 may operate at optimum process parameters.

Figure 3A:
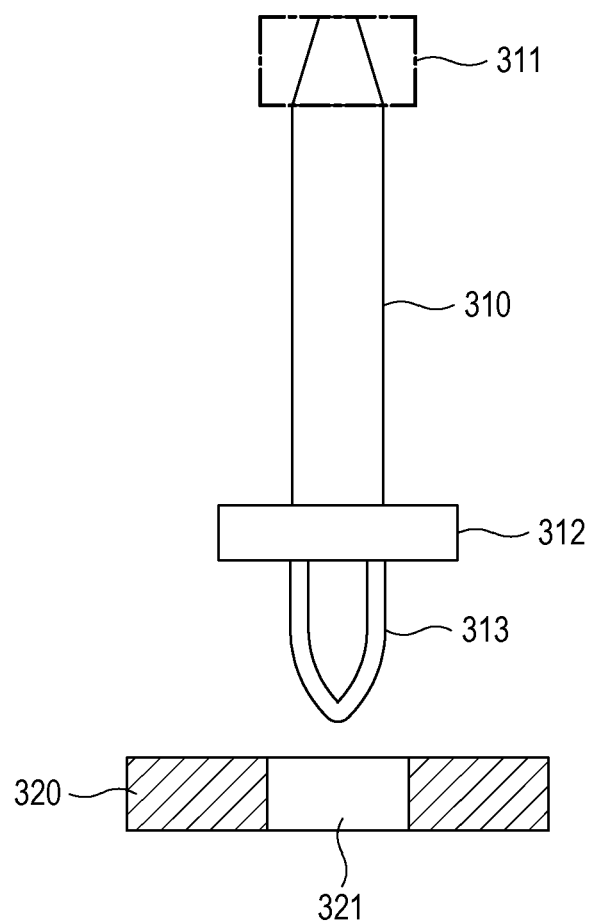
FIGS. 3A and 3B are side views of a pin according to various embodiments of the present disclosure.
Figure 3B:
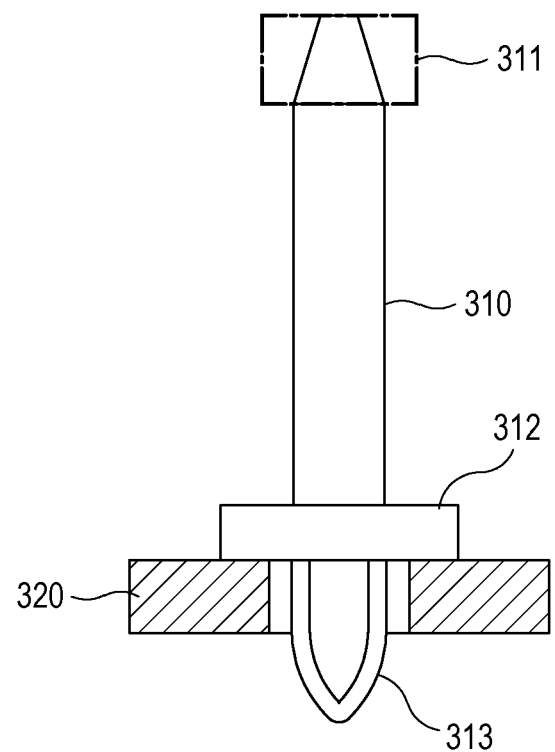

FIGS. 3A and 3B are side views of the pin according to various embodiments of the present disclosure. As shown in FIG. 3A, the upper end portion of the pin 310 may be denoted by a pin tip 311, the portion that makes contact with the substrate 320 upon insertion may be denoted by a pin shoulder 312, and the lower end portion of the pin 310 may be denoted by a pin tail 313. When the pin 310 is included in the housing of the connector (not shown), the portion extending from the pin tip 311 to the pin shoulder 312 may be located inside the housing of the connector, and only the pin tail 313 may be located outside the housing of the connector. Thus, when viewing the connector from the outside, only the pin tail 313 may be observed.

In addition, when the pin 310 is inserted into the substrate 320 as illustrated in FIG. 3B, at least a portion of the pin tail 313 may protrude from the substrate 320. Since the pin tail 313 is a portion of the pin 310, the protruding state of the pin tail 313 may be determined according to the insertion state of the pin 310. Therefore, the processor 250 may determine the insertion state of the pin 310 by inspecting the protruding state of the pin tail 313. In addition, since the pin 310 is included in the connector, the processor 250 may also determine the insertion state of the connector including the pin 310 by determining the insertion state of the pin 310.

Figure 4A:
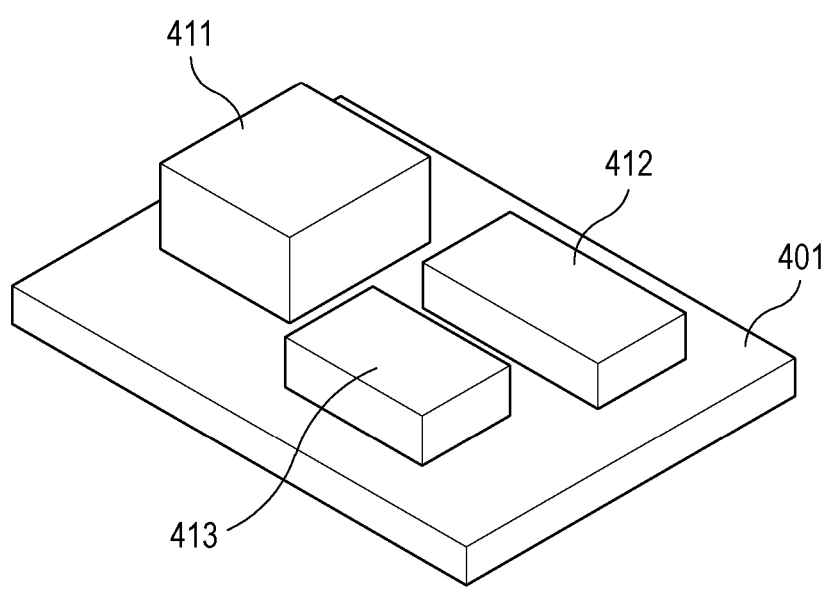
FIGS. 4A and 4B show a substrate into which a plurality of first connectors is inserted according to various embodiments of the present disclosure.
Figure 4B:
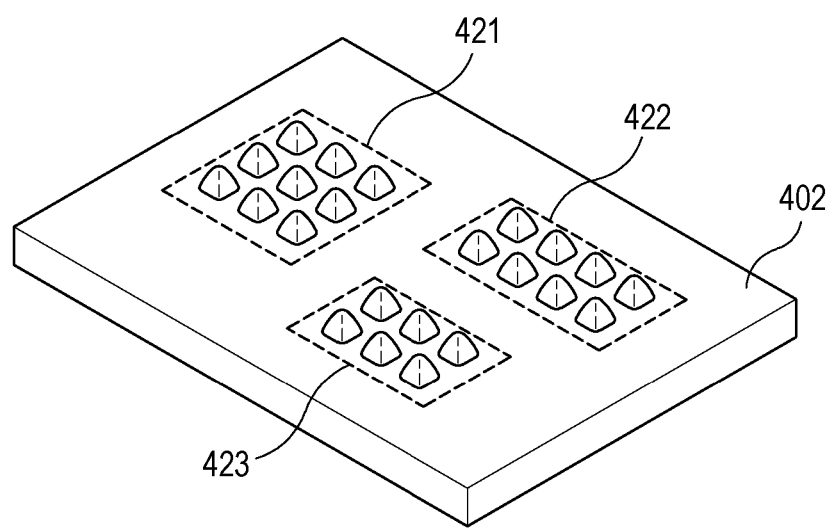

FIGS. 4A and 4B illustrate a substrate into which a plurality of first connectors is inserted according to various embodiments of the present disclosure. As shown in FIG. 4A, a plurality of first connectors 411, 412 and 413 may be inserted into the other surface 401 of the first substrate. Each of the plurality of first connectors 411, 412 and 413 includes a housing in which a plurality of pins is located. Therefore, when externally viewing the other surface 401 of the first substrate into which the plurality of first connectors 411, 412 and 413 is inserted, the plurality of pins included in each of the plurality of first connectors 411, 412 and 413 may not be observed.

In addition, as shown in FIG. 4B, at least portions of the pin tails of the plurality of pins 421, 422 and 423 included in each of the plurality of first connectors 411, 412 and 413 may protrude from one surface 402 of the first substrate. As described with reference to FIG. 1, due to the housing of the plurality of first connectors 411, 412 and 413, it is difficult for the processor 250 to directly inspect the plurality of pins 421, 422 and 423 included in each of the plurality of first connectors 411, 412 and 413. Thus, the processor may determine the insertion state of the connector based on the protruding state of the pin tail. Accordingly, the processor 250 may control the light source 220 such that the pattern light is emitted on the one surface 402 of the first substrate.

Figure 5A:
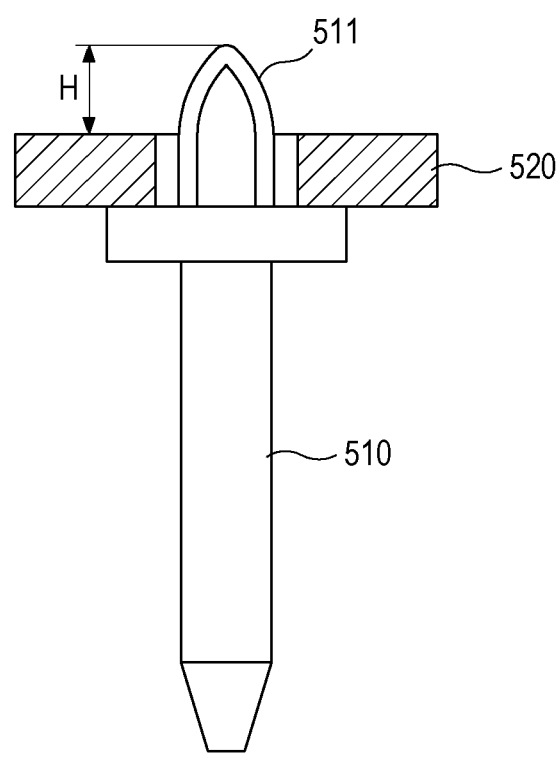
FIG. 5A is a side view of a pin inserted into a substrate according to various embodiments of the present disclosure.

FIG. 5A is a side view of the pin inserted into the substrate according to various embodiments of the present disclosure. Referring to FIG. 5A, the pin tail height H may be set to a height from the substrate 520 to the upper end portion of the pin tail 511 of the pin 510. However, this is merely for description purposes, and the present disclosure is not limited thereto. The pin tail height H may be set to a height from the substrate 520 to a specific portion of the pin tail 511.

Figure 5B:
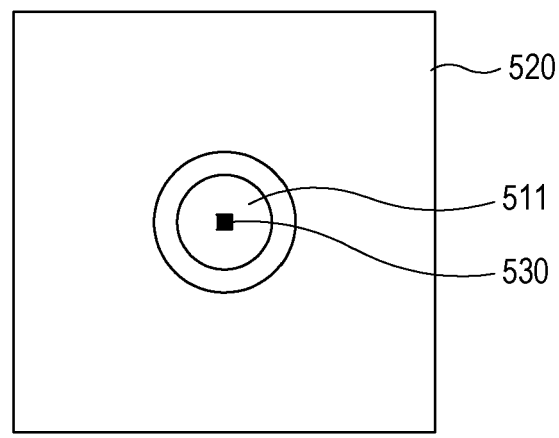
FIG. 5B is a top view of the pin inserted into the substrate according to various embodiments of the present disclosure.

FIG. 5B is a top view of the pin tail of the pin inserted into the substrate according to various embodiments of the present disclosure. Referring to FIG. 5B, the pin tail position may be set to the position of the center point 530 of the upper surface of the pin tail 511. However, this is merely for description purposes, and the present disclosure is not limited thereto. The pin tail position may be set to an arbitrary point on the upper surface of the pin tail 511 so as to specify the position of the pin tail 511. The processor 250 may measure the pin tail height and the pin tail position by using an image of the pin tail of each of the plurality of first pins.

FIG. 6 is a flowchart of a method for inspecting an insertion state of a plurality of connectors by the substrate inspection apparatus according to various embodiments of the present disclosure. In step 610, the light source 220 of the substrate inspection apparatus 100 may emit pattern light on one surface of the first substrate which is transferred from the connector insertion apparatus 110 and into which the plurality of first connectors is inserted. The one surface of the first substrate on which the pattern light is emitted and the other surface of the first substrate into which the plurality of first connectors is inserted may be opposite surfaces.

For example, when the first substrate transferred from the connector insertion apparatus 110 is located at a designated position for inspection, the processor 250 of the substrate inspection apparatus 100 may control the light source 220 such that the pattern light is emitted on the one surface of the first substrate. The processor 250 may control and rotate a support device (not shown) configured to support the first substrate and included in the substrate inspection apparatus 100 such that the one surface of the first substrate faces the light source 220. The processor 250 may control the light source 220 such that the pattern light is emitted after the support device is rotated such that the one surface 502 of the first substrate faces the light source 220.

In step 620, the processor 250 may generate insertion state information for the plurality of pins included in each of the plurality of first connectors by using the pattern light reflected from the pin tails of the plurality of pins included in each of the plurality of first connectors and received by the image sensor 230 of the substrate inspection apparatus 100. For example, the processor 250 may generate insertion state information for the plurality of pins included in each of the plurality of first connectors by using an image for the pin tail of each of the plurality of pins generated by the image sensor 230 by using the pattern light reflected from the pin tail of each of the plurality of pins. Furthermore, the processor 250 may receive information about the pattern light received from the image sensor 230, and may directly generate an image for the pin tail of each of the plurality of pins by using the information about the pattern light.

For example, the insertion state information may include information indicating a pin tail height of each of the plurality of pins included in the connector, and information indicating a pin tail position of each of the plurality of pins included in the connector. As described with reference to FIG. 1, the processor 250 may determine the insertion state of the connector based on the protruding state of the pin tail determined by using the pin tail height and the pin tail position. Therefore, the insertion state information may include information indicating a pin tail height and information indicating a pin tail position.

In step 630, the processor 250 may detect at least one second connector having an insertion defect among the plurality of first connectors by using the insertion reference information stored in the memory 240 and the insertion state information of each of the plurality of first connectors. For example, the processor 250 may detect at least one second connector having an insertion defect by using the information indicating the pin tail height or the information indicating the pin tail position, which is included in the insertion state information of the plurality of pins included in each of the plurality of first connectors.

In step 640, the processor 250 may generate a control signal for adjusting at least one first process parameter among the plurality of process parameters of the connector insertion apparatus 110, based on the insertion state information of each of the plurality of pins included in at least one second connector detected to have an insertion defect. For example, the processor 250 may determine at least one first process parameter available for improvement of an insertion defect of at least one second connector, among the plurality of process parameters, based on the insertion state information of the plurality of pins included in at least one second connector.

For example, the processor 250 may determine at least one first process parameter available for improvement of an insertion defect among the plurality of process parameters, and an adjustment value of the at least one first process parameter, by further using the information about a plurality of process parameters and the information about values of the plurality of process parameters stored in the memory 240. Hereinafter, for the sake of convenience of description, the description will be made by focusing on a case where an adjustment value of at least one first process parameter to be adjusted is determined as a specific value. However, the present disclosure is not limited thereto. The processor 250 may determine a range of an adjustment value of at least one first process parameter. The processor 250 may generate a control signal for adjusting the at least one first process parameter, based on the determined adjustment value of the at least one first process parameter.

In addition, when the at least one first process parameter is adjusted just as much as the adjustment value of the at least one first process parameter, the processor 250 may display the predicted insertion state information of the plurality of pins included in at least one second connector on the display 260. This enables the user to confirm whether the at least one first process parameter has been properly adjusted.

In step 650, the processor 250 may control the communication circuit 210 to transmit the control signal generated in step 640 to the connector insertion apparatus 110. The connector insertion apparatus 110 may adjust at least one first process parameter according to the received control signal. After adjusting the at least one first process parameter, the connector insertion apparatus 110 may perform a process of inserting a plurality of first connectors into a substrate again.

FIG. 7 is a flowchart of a method for detecting at least one second connector having an insertion defect by using a pin tail position according to various embodiments of the present disclosure. In step 710, the processor 250 of the substrate inspection apparatus 100 may identify a pin tail reference position of each of the plurality of pins included in each of the plurality of first connectors based on the insertion reference information stored in the memory 240. The pin tail reference position of each of the plurality of pins included in each of the plurality of first connectors may be a position corresponding to a reference position at which the plurality of pins included in each of the plurality of first connectors is inserted into the first substrate. For example, the pin tail reference position of each of the plurality of pins may be set to be the same as the position at which each of the plurality of pins is inserted. The pin tail reference position of each of the plurality of pins included in each of the plurality of first connectors may be set based on the design information of the first substrate, or may be set according to a user input regardless of the design information of the first substrate.

In step 720, the processor 250 may identify the pin tail position of each of the plurality of pins included in each of the plurality of first connectors, based on the insertion state information of the plurality of pins included in each of the plurality of first connectors, which is generated in step 620 of FIG. 6. As described above, the pin tail position of each of the plurality of pins included in each of the plurality of first connectors may be a position of the center point of the upper surface of the pin tail of each of the plurality of pins.

In step 730, the processor 250 may calculate a difference between the pin tail reference position of each of the plurality of pins included in each of the plurality of first connectors and the pin tail position of each of the plurality of pins included in each of the plurality of first connectors. The processor 250 may determine occurrence or non-occurrence of an insertion defect depending on whether each of the plurality of pins included in each of the plurality of first connectors is correctly inserted at the reference position. The processor 250 may determine whether each of the plurality of pins included in each of the plurality of first connectors is correctly inserted at the reference position, by using the pin tail position of each of the plurality of pins included in each of the plurality of first connectors.

In step 740, when at least one connector including at least one pin in which the difference calculated in step 730 is equal to or greater than a preset first threshold value is detected from among the plurality of first connectors, the processor 250 may determine the detected at least one connector as at least one second connector having the insertion defect. For example, the first threshold value is a reference value for determining whether each of the plurality of first pins included in each of the plurality of first connectors is inserted at a preset reference position, and may be set according to the design information of the first substrate or a user input. The processor 250 may determine that the at least one connector including the at least one pin in which the calculated difference is equal to or greater than the first threshold value has an insertion defect, and may detect the at least one connector as at least one second connector having an insertion defect.

Furthermore, the processor 250 may display information about the at least one second connector on the display 260 of the substrate inspection apparatus 100. For example, the information about the at least one second connector may include shape information of the at least one second connector, pin tail position information of each of the plurality of pins included in the connector, and the like. However, this is merely for description purposes, and the present disclosure is not limited thereto. The information about the at least one second connector displayed on the display 260 may include various kinds of information about the at least one second connector for enabling the user to easily recognize the at least one second connector among the plurality of first connectors.

FIG. 8 is a flowchart of a method for generating a control signal for adjusting a process parameter, based on insertion state information of at least one second connector having an insertion defect detected by using a pin tail position according to various embodiments of the present disclosure. In step 810, the processor 250 of the substrate inspection apparatus 100 may determine at least one process parameter available for adjusting the difference between the pin tail reference position of each of the plurality of pins included in the at least one second connector having an insertion defect detected at step 740 of FIG. 7 and the pin tail position of each of the plurality of pins included in the at least one second connector among the plurality of process parameters of the connector insertion apparatus 110, as at least one first process parameter to be adjusted.

In one embodiment, the at least one process parameter available for adjusting the difference between the pin tail reference position and the pin tail position of each of the plurality of pins included in the at least one second connector among the plurality of process parameters may be a process parameter that may affect the pin tail position of each of the plurality of pins included in the connector on the substrate in the connector insertion process of the connector insertion apparatus 110. The processor 250 may determine at least one process parameter that may affect the pin tail position of each of the plurality of pins included in the connector, among the plurality of process parameters, by further using the information about the plurality of process parameters of the connector insertion apparatus 110 stored in the memory 240.

For example, the at least one process parameter that may affect the pin tail position of each of the plurality of pins included in the connector may include at least one process parameter that may adjust the connector insertion position, a process parameter for adjusting a movement speed of a connector insertion head used for connector insertion, and the like. However, this is merely for description purposes, and the present disclosure is not limited thereto. The at least one process parameter that may affect the pin insertion position of each of the plurality of pins included in the connector may include various process parameters of the connector insertion apparatus 110 that may affect the pin insertion position of each of the plurality of pins included in the connector in the connector insertion process.

In step 820, the processor 250 may generate the control signal for adjusting the at least one first process parameter determined in step 810 such that the difference between the pin tail reference position and the pin tail position of each of the plurality of pins included in the at least one second connector becomes less than the first threshold value. The processor 250 may determine an adjustment value of the at least one first process parameter for assuring that the difference between the pin tail reference position and the pin tail position of each of the plurality of pins included in the at least one second connector becomes less than the first threshold value, by further using the information about values of the plurality of process parameters stored in the memory 240.

For example, the processor 250 may identify the value of the at least one first process parameter used in the connector insertion process for the first substrate performed by the connector insertion apparatus 110, using information about the values of the plurality of process parameters. When the at least one first process parameter is adjusted just as much as a specific value based on the value of the at least one first process parameter and the pin tail position of each of the plurality of pins included in the at least one second connector, the processor 250 may predict how much the pin tail position of each of the plurality of pins included in the at least one second connector will change. The processor 250 may determine an adjustment value of the at least one first process parameter according to the prediction result. The processor 250 may generate a control signal for adjusting the at least one first process parameter, based on the determined adjustment value of the at least one first process parameter.

FIG. 9 illustrates the pin included in the connector having an insertion defect detected by using the pin tail position according to various embodiments of the present disclosure. According to various embodiments of the present disclosure, the processor 250 of the substrate inspection apparatus 100 may measure the pin tail position 931 of the pin 910 by using the position of the center point of the upper surface of the pin tail 911 of the pin 910. The processor 250 may calculate a difference Δx between the pin tail position 931 of the pin 910 and the pin tail reference position 932 of the pin 910 identified based on the insertion reference information stored in the memory 240. As shown in FIG. 9, the pin tail reference position 932 of the pin 910 may be set to a position of a center point of a hole 921 of a substrate 920 into which the pin 910 is to be inserted.

The processor 250 may determine whether the difference Δx is equal to or greater than a preset first threshold value. When it is determined that the difference Δx is equal to or greater than the first threshold value, the processor 250 may determine that the connector including the pin 910 has an insertion defect. The processor 250 may generate a control signal for adjusting at least one first process parameter among the plurality of process parameters of the connector insertion apparatus 110 as described with reference to FIG. 8 such that the difference Δx becomes less than the first threshold value, and may transmit the control signal to the connector insertion apparatus 110.

The connector insertion apparatus 110 may perform a process of adjusting at least one first process parameter according to the received control signal and inserting a plurality of first connectors into a substrate. This makes it possible to improve the connector insertion defect in the subsequent connector insertion process.

Figure 10:
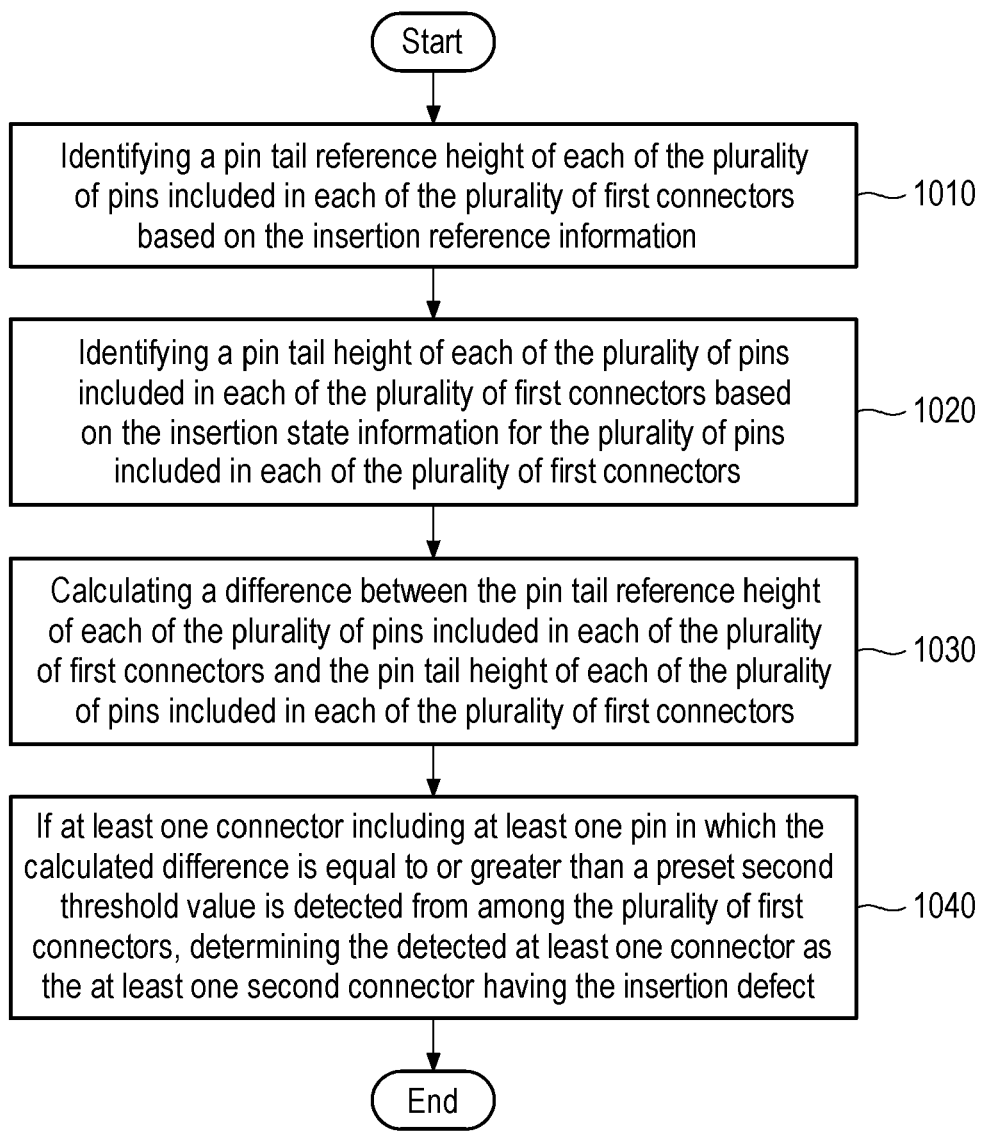
FIG. 10 is a flowchart of a method for detecting at least one second connector having an insertion defect by using a pin tail height according to various embodiments of the present disclosure.

FIG. 10 is a flowchart of a method for detecting at least one second connector having an insertion defect by using a pintail height according to various embodiments of the present disclosure. In step 1010, the processor 250 of the substrate inspection apparatus 100 may identify the pin tail reference height of each of the plurality of pins included in each of the plurality of first connectors based on the insertion reference information stored in the memory 240. The pin tail reference height of each of the plurality of pins included in each of the plurality of first connectors may be set to a height that serves as a reference for determining whether the plurality of pins included in each of the plurality of first connectors is inserted so that the pin shoulders of the plurality of pins make contact with the first substrate. Accordingly, when the plurality of pins is not inserted so that the pin shoulders of the plurality of pins make contact with the first substrate, the pin tail height may be smaller than the pin tail reference height. The pin tail reference height of each of the plurality of pins included in each of the plurality of first connectors may be set based on the design information of the first substrate, or may be set according to a user input regardless of the design information of the first substrate.

In step 1020, the processor 250 may identify the pin tail height of each of the plurality of pins included in each of the plurality of first connectors based on the insertion state information of the plurality of pins included in each of the plurality of first connectors, which is generated in step 620. As described above, the pin tail height of each of the plurality of pins included in each of the plurality of first connectors may be set to a height extending from one surface of the first substrate to the upper end portion of the pin tail.

In step 1030, the processor 250 may calculate a difference between the pin tail reference height of each of the plurality of pins included in each of the plurality of first connectors and the pin tail height of each of the plurality of pins included in each of the plurality of first connectors. The processor 250 may determine occurrence or non-occurrence of an insertion defect depending on whether the plurality of pins is inserted so that the pin shoulders of the plurality of pins make contact with the first substrate. The processor 250 may determine whether the plurality of pins is inserted so that the pin shoulders of the plurality of pins make contact with the first substrate, by using the pin tail height of each of the plurality of pins included in each of the plurality of first connectors.

In step 1040, when at least one connector including at least one pin in which the difference calculated in step 1030 is equal to or greater than a preset second threshold value is detected from among the plurality of first connectors, the processor 250 may determine the at least one connector as at least one second connector having the insertion defect. For example, the second threshold value is a reference value for determining whether the plurality of pins is inserted so that the pin shoulders of the plurality of pins make contact with the first substrate, and may be set according to the design information of the first substrate or the user input. The processor 250 may determine that the at least one connector including at least one pin in which the calculated difference is equal to or greater than the second threshold value has an insertion defect, and may determine the at least one connector as at least one second connector having the insertion defect. Furthermore, the processor 250 may display information about the at least one second connector on the display 260 of the substrate inspection apparatus 100. This enables the user to identify at least one second connector having an insertion defect.

Figure 11:
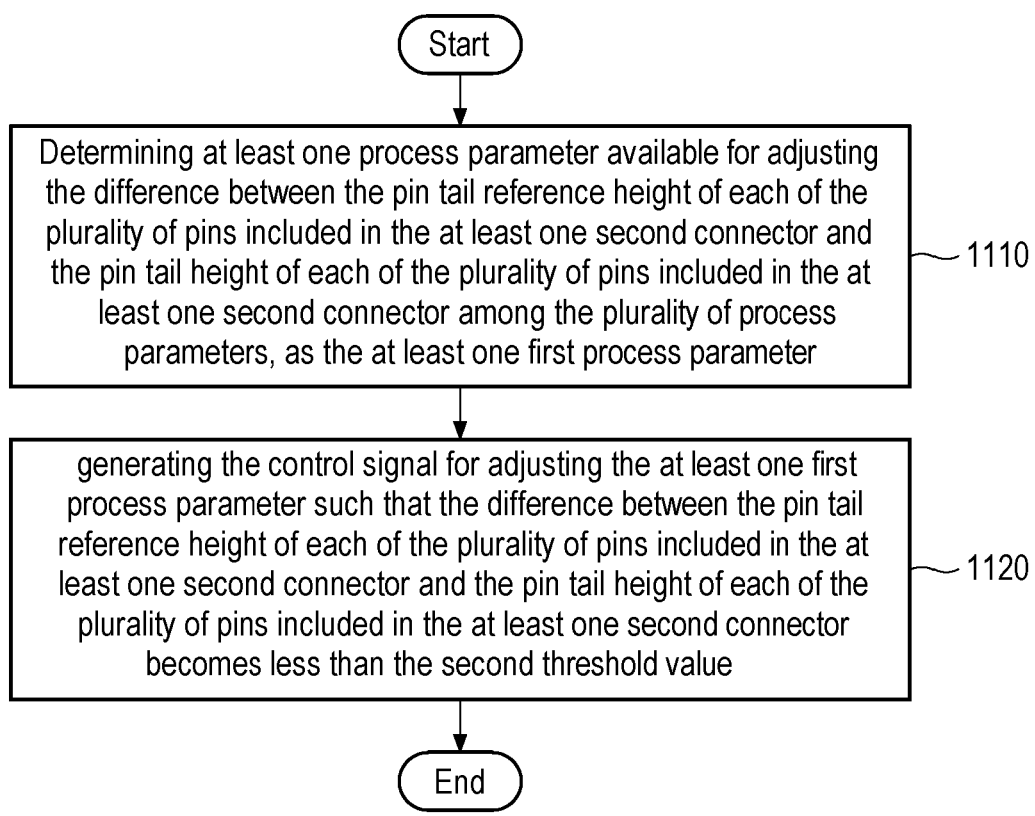
FIG. 11 is a flowchart of a method for generating a control signal for adjusting a process parameter, based on insertion state information of at least one second connector having an insertion defect detected by using the pin tail height according to various embodiments of the present disclosure.

FIG. 11 is a flowchart of a method for generating a control signal for adjusting a process parameter, based on insertion state information of at least one second connector having an insertion defect detected by using a pin tail height according to various embodiments of the present disclosure. In step 1110, the processor 250 of the substrate inspection apparatus 100 may determine at least one process parameter available for adjusting the difference between the pin tail reference height of each of the plurality of pins included in the at least one second connector having an insertion defect detected in step 1040 and the pin tail height of each of the plurality of pins included in the at least one second connector among the plurality of process parameters of the connector insertion apparatus 110, as at least one first process parameter to be adjusted.

In one embodiment, the at least one process parameter available for adjusting the difference between the pin tail reference height and the pin tail height of each of the plurality of pins included in the at least one second connector among the plurality of process parameters may be a process parameter that may affect the pin tail height of each of the plurality of pins included in the connector on the substrate in the connector insertion process of the connector insertion apparatus 110. The processor 250 may determine at least one process parameter that may affect the pin tail height of each of the plurality of pins included in the connector, among the plurality of process parameters, by further using the information about the plurality of process parameters of the connector insertion apparatus 110 stored in the memory 240.

For example, the at least one process parameter that may affect the pin tail height of each of the plurality of pins included in the connector may include a process parameter for adjusting a connector insertion force, a process parameter for adjusting a connector insertion speed, a process parameter for adjusting a position of an anvil, and the like. However, this is merely for description purposes, and the present disclosure is not limited thereto. The at least one process parameter that may affect the pin tail height of each of the plurality of pins included in the connector may include various process parameters of the connector insertion apparatus 110 that may affect the pin tail height of each of the plurality of pins included in the connector in the connector insertion process.

In step 1120, the processor 250 may generate the control signal for adjusting the at least one first process parameter determined in step 1110 such that the difference between the pin tail reference height and the pin tail height of each of the plurality of pins included in the at least one second connector becomes less than the second threshold value. The processor 250 may determine an adjustment value of the at least one first process parameter for assuring that the difference between the pin tail reference height and the pin tail height of each of the plurality of pins included in the at least one second connector becomes less than the second threshold value, by further using the information about values of the plurality of process parameters stored in the memory 240.

For example, the processor 250 may identify the value of the at least one first process parameter used in the connector insertion process for the first substrate performed by the connector insertion apparatus 110, using information about the values of the plurality of process parameters. When the at least one first process parameter is adjusted just as much as a specific value based on the value of the at least one first process parameter and the pin tail height of each of the plurality of pins included in the at least one second connector, the processor 250 may predict how much the pin tail height of each of the plurality of pins included in the at least one second connector will change. The processor 250 may determine an adjustment value of the at least one first process parameter according to the prediction result. The processor 250 may generate a control signal for adjusting the at least one first process parameter, based on the determined adjustment value of the at least one first process parameter.

Figure 12:
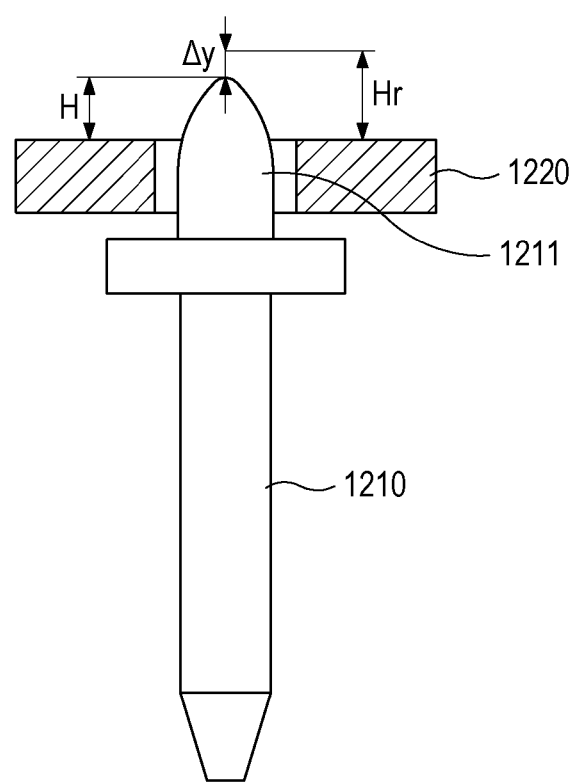
FIG. 12 illustrates the pin included in the connector having an insertion defect detected by using the pin tail height according to various embodiments of the present disclosure.

FIG. 12 illustrates the pin included in the connector having an insertion defect detected by using the pin tail height according to various embodiments of the present disclosure. According to various embodiments of the present disclosure, the processor 250 of the substrate inspection apparatus 100 may measure the height from the substrate 1220 to the upper end portion of the pin tail 1211 of the pin 1210 as the pin tail height H of the pin 1210. In addition, the processor 250 may calculate a difference Δy between the pin tail height H of the pin 1210 and the reference height Hr of the pin 1210 identified based on the insertion reference information stored in the memory 240.

The processor 250 may determine whether the difference Δy is equal to or greater than a preset second threshold value. When it is determined that the difference Δy is equal to or greater than the second threshold value, the processor 250 may determine that the pin 1210 has an insertion defect. The processor 250 may generate a control signal for adjusting at least one first process parameter among the plurality of process parameters of the connector insertion apparatus 110 as described with reference to FIG. 11 such that the difference Δy becomes less than the second threshold value, and may transmit the control signal to the connector insertion apparatus 110.

The connector insertion apparatus 110 may perform a process of adjusting at least one first process parameter according to the received control signal and inserting a plurality of first pins into a substrate. This makes it possible to improve the pin insertion defect in the subsequent pin insertion process.

While the foregoing methods have been described with respect to particular embodiments, these methods may also be implemented as computer-readable codes on a computer-readable recording medium. The computer-readable recoding medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed on computer systems which are connected through a network so that the computer-readable codes can be stored and executed in a distributed manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that such substitutions, modifications and changes are intended to fall within the scope of the appended claims.

What is claimed is:

1. A substrate inspection apparatus for inspecting insertion states of a plurality of pins included in each of a plurality of first connectors inserted into respective holes of a first substrate, comprising:
    a communication circuit configured to communicate with a connector insertion apparatus, the connector insertion apparatus configured to insert the plurality of first connectors including the plurality of pins into the holes of the first substrate;
    a plurality of light sources configured to emit pattern light on a first surface of the first substrate into which the pins of the plurality of first connectors are inserted by the connector insertion apparatus, the plurality of first connectors being inserted into the holes from a second surface of the first substrate opposite the first surface;
    an image sensor configured to receive the pattern light reflected from a pin tail of each of the plurality of pins included in each of the plurality of first connectors;
    at least one memory configured to store insertion reference information indicating a pin tail reference height and a pin tail reference position set for each of the plurality of pins included in each of the plurality of first connectors; and
    at least one processor,
    wherein the at least one processor is configured to:
    generate insertion state information indicating an insertion state of each of the plurality of pins included in each of the plurality of first connectors by using the pattern light reflected from the pin tail of each of the plurality of pins included in each of the plurality of first connectors and received by the image sensor;
    detect at least one second connector having an insertion defect from among the plurality of first connectors by using the insertion reference information and the insertion state information of each of the plurality of pins included in each of the plurality of first connectors;
    generate a control signal for adjusting at least one first process parameter among a plurality of process parameters of the connector insertion apparatus, based on the insertion state information of each of the plurality of pins included in the at least one second connector; and
    control the communication circuit to transmit the control signal to the connector insertion apparatus.

2. The apparatus of claim 1, wherein the insertion state information includes information indicating a pin tail height, and information indicating a pin tail position.

3. The apparatus of claim 1, wherein the plurality of process parameters includes a process parameter for adjusting a connector insertion force, a process parameter for adjusting a connector insertion position, a process parameter for adjusting a connector insertion speed, and a process parameter for adjusting a movement speed of a connector insertion head used for connector insertion.

4. The apparatus of claim 1, wherein the at least one processor is configured to:
  identify a pin tail reference position of each of the plurality of pins included in each of the plurality of first connectors based on the insertion reference information;
  identify a pin tail position of each of the plurality of pins included in each of the plurality of first connectors based on the insertion state information;
  calculate a difference between the pin tail reference position of each of the plurality of pins included in each of the plurality of first connectors and the pin tail position of each of the plurality of pins included in each of the plurality of first connectors; and
  if at least one connector including at least one pin in which the calculated difference is equal to or greater than a preset first threshold value is detected from among the plurality of first connectors, determine the detected at least one connector as the at least one second connector having the insertion defect.

5. The apparatus of claim 4, wherein the at least one processor is configured to:
  determine at least one process parameter available for adjusting the difference between the pin tail reference position of each of the plurality of pins included in the at least one second connector and the pin tail position of each of the plurality of pins included in the at least one second connector among the plurality of process parameters, as the at least one first process parameter; and
  generate the control signal for adjusting the at least one first process parameter such that the difference between the pin tail reference position of each of the plurality of pins included in the at least one second connector and the pin tail position of each of the plurality of pins included in the at least one second connector becomes less than the first threshold value.

6. The apparatus of claim 1, wherein the at least one processor is configured to:
  identify a pin tail reference height of each of the plurality of pins included in each of the plurality of first connectors based on the insertion reference information;
  identify a pin tail height of each of the plurality of pins included in each of the plurality of first connectors based on the insertion state information;
  calculate a difference between the pin tail reference height of each of the plurality of pins included in each of the plurality of first connectors and the pin tail height of each of the plurality of pins included in each of the plurality of first connectors; and
  if at least one connector including at least one pin in which the calculated difference is equal to or greater than a preset second threshold value is detected from among the plurality of first connectors, determine the detected at least one connector as the at least one second connector having the insertion defect.

7. The apparatus of claim 6, wherein the at least one processor is configured to:
  determine at least one process parameter available for adjusting the difference between the pin tail reference height of each of the plurality of pins included in the at least one second connector and the pin tail height of each of the plurality of pins included in the at least one second connector among the plurality of process parameters, as the at least one first process parameter; and
  generate the control signal for adjusting the at least one first process parameter such that the difference between the pin tail reference height of each of the plurality of pins included in the at least one second connector and the pin tail height of each of the plurality of pins included in the at least one second connector becomes less than the second threshold value.

8. A method for inspecting insertion states of a plurality of pins included in each of a plurality of first connectors inserted into respective holes of a first substrate by a substrate inspection apparatus, comprising:
  emitting pattern light on a first surface of the first substrate into which the pins of the plurality of first connectors are inserted into the holes of the first substrate by a connector insertion apparatus, the plurality of first connectors being inserted into the holes from a second surface of the first substrate opposite the first surface;
  receiving the pattern light reflected from a pin tail of each of the plurality of pins included in each of the plurality of first connectors;
  generating insertion state information indicating an insertion state of each of the plurality of pins included in each of the plurality of first connectors by using the received pattern light reflected from the pin tail of each of the plurality of pins included in each of the plurality of first connectors;
  detecting at least one second connector having an insertion defect from among the plurality of first connectors by using insertion reference information indicating a pin tail reference height and a pin tail reference position set for each of the plurality of pins included in each of the plurality of first connectors and the insertion state information;
  generating a control signal for adjusting at least one first process parameter among a plurality of process parameters of the connector insertion apparatus, based on the insertion state information of each of the plurality of pins included in the at least one second connector; and
  transmitting the control signal to the connector insertion apparatus.

9. The method of claim 8, wherein the insertion state information includes information indicating a pin tail height of each of the plurality of pins included in each of the plurality of connectors and information indicating a pin tail position of each of the plurality of pins included in each of the plurality of connectors.

10. The method of claim 8, wherein the plurality of process parameters includes a process parameter for adjusting a connector insertion force, a process parameter for adjusting a connector insertion position, a process parameter for adjusting a connector insertion speed, and a process parameter for adjusting a movement speed of a connector insertion head used for connector insertion.

11. The method of claim 8, wherein the step of detecting at least one second connector having the insertion defect includes:
  identifying a pin tail reference position of each of the plurality of pins included in each of the plurality of first connectors based on the insertion reference information;
  identifying a pin tail position of each of the plurality of pins included in each of the plurality of first connectors based on the insertion state information;
  calculating a difference between the pin tail reference position of each of the plurality of pins included in each of the plurality of first connectors and the pin tail position of each of the plurality of pins included in each of the plurality of first connectors; and if at least one connector including at least one pin in which the calculated difference is equal to or greater than a preset first threshold value is detected from among the plurality of first connectors, determining the detected at least one connector as the at least one second connector having the insertion defect.

12. The method of claim 11, wherein the step of generating a control signal for adjusting at least one first process parameter includes:

determining at least one process parameter available for adjusting the difference between the pin tail reference position of each of the plurality of pins included in the at least one second connector and the pin tail position of each of the plurality of pins included in the at least one second connector among the plurality of process parameters, as the at least one first process parameter; and generating the control signal for adjusting the at least one first process parameter such that the difference between the pin tail reference position of each of the plurality of pins included in the at least one second connector and the pin tail position of each of the plurality of pins included in the at least one second connector becomes less than the first threshold value.

13. The method of claim 8, wherein the step of detecting at least one second connector having the insertion defect includes:

identifying a pin tail reference height of each of the plurality of pins included in each of the plurality of first connectors based on the insertion reference information;

identifying a pin tail height of each of the plurality of pins included in each of the plurality of first connectors based on the insertion state information;

calculating a difference between the pin tail reference height of each of the plurality of pins included in each of the plurality of first connectors and the pin tail height of each of the plurality of pins included in each of the plurality of first connectors; and if at least one connector including at least one pin in which the calculated difference is equal to or greater than a preset second threshold value is detected from among the plurality of first connectors, determining the detected at least one connector as the at least one second connector having the insertion defect.

14. The method of claim 13, wherein the step of generating a control signal for adjusting at least one first process parameter includes:

determining at least one process parameter available for adjusting the difference between the pin tail reference height of each of the plurality of pins included in the at least one second connector and the pin tail height of each of the plurality of pins included in the at least one second connector among the plurality of process parameters, as the at least one first process parameter; and generating the control signal for adjusting the at least one first process parameter such that the difference between the pin tail reference height of each of the plurality of pins included in the at least one second connector and the pin tail height of each of the plurality of pins included in the at least one second connector becomes less than the second threshold value.

\* \* \* \* \*